(12) United States Patent
Ardehali (10) Patent No.: US 8,810,323 B2
(45) Date of Patent: Aug. 19, 2014

(54) LOW-POWER VOLTAGE-CONTROLLED OSCILLATOR

(76) Inventor: Mohammad Ardehali, Palo Alto, CA (US)

( * ) Notice: Subject to any disclaimer, the term of this patent is extended or adjusted under 35 U.S.C. 154(b) by 0 days.

(21) Appl. No.: 13/358,701

(22) Filed: Jan. 26, 2012

(65) Prior Publication Data

US 2013/0194043 A1    Aug. 1, 2013

(51) Int. Cl.
*H03K 3/03* (2006.01)

(52) U.S. Cl.
USPC ............. 331/57; 331/183; 331/175; 327/266; 327/554

(58) Field of Classification Search
USPC ..................... 331/57, 183, 175; 327/266, 554
See application file for complete search history.

(56) References Cited

U.S. PATENT DOCUMENTS

| | | | | |
|---|---|---|---|---|
| 5,686,867 A | * | 11/1997 | Sutardja et al. | 331/57 |
| 6,348,839 B1 | * | 2/2002 | Aramaki | 331/57 |
| 7,639,093 B2 | | 12/2009 | Ardehali | |
| 7,760,032 B2 | | 7/2010 | Ardehali | |
| 8,207,795 B2 | * | 6/2012 | Wang | 331/57 |

* cited by examiner

*Primary Examiner* — Arnold Kinkead
(74) *Attorney, Agent, or Firm* — TIPS Group (57) ABSTRACT

In one embodiment, a voltage-controlled oscillator (VCO) is provided that includes: a plurality of differential inverters coupled to form a loop, each differential inverter having a differential pair of transistors configured to steer a tail current from a current source, the current source sourcing the tail current responsive to a bias voltage, wherein each transistor in the differential pair couples to a power source through a corresponding switching-capacitor circuit; and a bias circuit configured to generate the bias voltage such that a transconductance for each transistor in the differential pairs is proportional to a factor that is a function of a ratio of transistor widths within the bias circuit.

7 Claims, 8 Drawing Sheets

LOW-POWER VOLTAGE-CONTROLLED OSCILLATOR

TECHNICAL FIELD

The present invention relates generally to voltage controlled oscillators and more particularly to a voltage controlled oscillator whose start up conditions are independent of process corners, temperatures, and supply voltage.

BACKGROUND

Ring oscillators are popular in applications such as voltage controlled oscillators (VCOs), clock generation in microprocessor, carrier synthesis in cellular phones, phase-locked loops, and data and clock recovery circuits. A ring oscillator is denoted as a free-running oscillator in that no timing signal or control signal is used to initiate the oscillation. Ring-oscillator-implemented VCOs and related free-running oscillator components are among the most power-hungry components in any electronic system. Thus low-power VCO design poses fundamental challenges.

Accordingly, there is a need in the art for improved low-power VCO designs.

SUMMARY

In one embodiment, a ring oscillator is provided that includes: a plurality of differential inverters coupled to form a loop, each differential inverter having a differential pair of transistors configured to steer a tail current from a current source, the current source sourcing the tail current responsive to a bias voltage; and a bias circuit configured to generate the bias voltage such that a transconductance for each transistor in the differential pairs is proportional to a factor that is a function of a ratio of device widths within the bias circuit.

In another embodiment, a voltage-controlled oscillator (VCO is provided that includes: a plurality of differential inverters coupled to form a loop, each differential inverter having a differential pair of transistors configured to steer a tail current from a current source, the current source sourcing the tail current responsive to a bias voltage, wherein each transistor in the differential pair couples to a power source through a corresponding switching-capacitor circuit; and a bias circuit configured to generate the bias voltage such that a transconductance for each transistor in the differential pairs is proportional.

In another embodiment, a phase-locked loop (PLL) is provided that includes: a phase detector configured to compare the phase between a divided signal and an input signal to provide a phase detector output; a loop filter to filter the phase detector output to provide a tuning voltage; and a voltage-controlled oscillator (VCO) including a plurality of differential inverters coupled to form a loop, each differential inverter having a differential pair of transistors configured to steer a tail current from a current source, the current source sourcing the tail current responsive to a bias voltage, wherein each transistor in the differential pair couples to a power source through a corresponding switching-capacitor circuit having an adjustable capacitance responsive to the tuning voltage; and a bias circuit configured to generate the bias voltage such that a transconductance for each transistor in the differential pairs is proportional to a factor that is a function of a ratio of transistor widths within the bias circuit.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

To provide a low-power VCO whose startup conditions are independent of process corner and temperature, a ring-oscillator having the same independence for its startup conditions will first be addressed.

Free-Running Oscillator

Figure 1A:
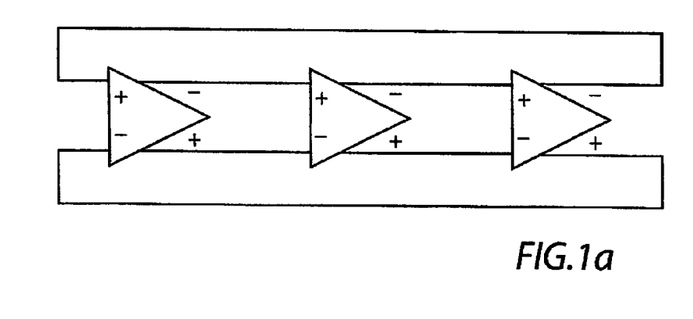
FIG. 1a is a diagram of a 3-stage ring oscillator.
Figure 1B:
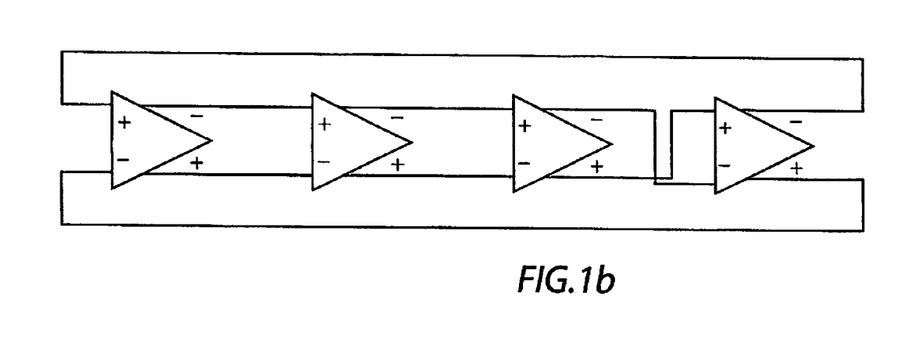
FIG. 1b is a diagram of a 4-stage ring oscillator.

A ring oscillator typically includes an odd number of inverters coupled together in a loop. To eliminate common-mode noise, its conventional to use differential or double-ended inverters as shown in FIG. 1(a). In contrast, if an even number of inverters are coupled together in this fashion, a latch results unless one of the stages is configured to be non-inverting as shown in FIG. 1(b). To form a voltage-controlled oscillator (VCO), each inverter stage in a ring oscillator is configured so that its propagation delay is responsive to a control voltage.

Figure 2:
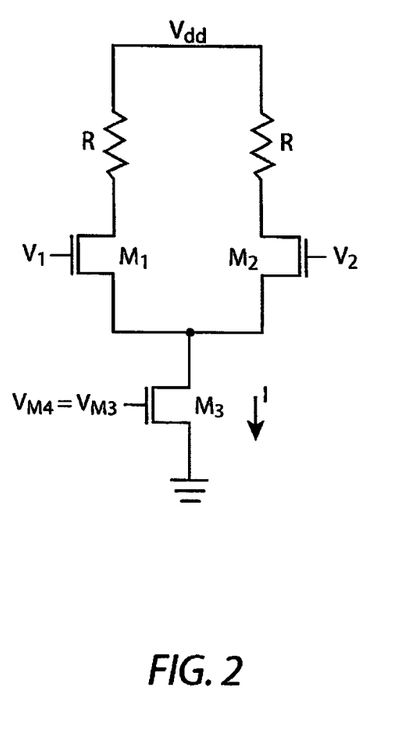
FIG. 2 is a circuit diagram for a differential inverter stage in the ring oscillators of FIGS. 1a and 1b.

A conventional differential inverter stage 200 is shown in FIG. 2. Stage 200 uses NMOS transistors $M_1$, $M_2$ and $M_3$ but it will be appreciated that stage 200 may be implemented using an equivalent PMOS embodiment. $M_3$ acts as a current source with regard to a tail current I. Transistors $M_1$ and $M_2$ form a differential pair of transistors that steer the tail current I responsive to differential input voltages $V_1$ and $V_2$. As $V_1$ is made higher than $V_2$ by a multiple of the threshold voltage $V_T$ for transistors $M_1$ and $M_2$, the tail current I will conduct virtually entirely through $M_1$. Similarly, as $V_2$ gets higher than $V_1$, the tail current I steers over to $M_2$ to conduct virtually entirely through $M_2$. During oscillation, the voltage $V_1$ and $V_2$ successively switch in this fashion to continually steer the tail current I back and forth between transistors $M_1$ and $M_2$.

This oscillation occurs when a product of the transconductance for M1 and M2 (since these transistors are matched, their common transconductance may be denoted as $g_{m1,2}$) and load resistance R exceeds or equals 1 (the well-known Barkhausen stability condition for oscillation). The transconductance $g_{m1,2}$ thus plays a key role in determining the startup condition for a free-running oscillator (and any VCO containing such an oscillator). In any differential pair of transistors $M_1$ and $M_2$, their transconductance is proportional to the transconductance for the current-source transistor $M_3$ (which may be denoted as $g_{m3}$). Thus, the transconductance $g_{m1,2}$ equals A $g_{m3}$ where A is a proportionality constant. In particular, if $M_1$, $M_2$ and $M_3$ all have the same width and length, then $g_{m1,2} = g_{m3}I$ sqrt(2) since at equilibrium, the current through $M_1$ and $M_2$ is half the current through $M_3$, where sqrt represents the square root function.

To provide a low power VCO that is insensitive to process corners and temperature variations, the transconductance $g_{m3}$ for $M_3$ is made proportional to 1/R, where R is the load resistance. As will be discussed further herein, the startup condition for oscillation then becomes just a ratio of resistances and hence becomes independent of temperature and process corner.

Figure 3:
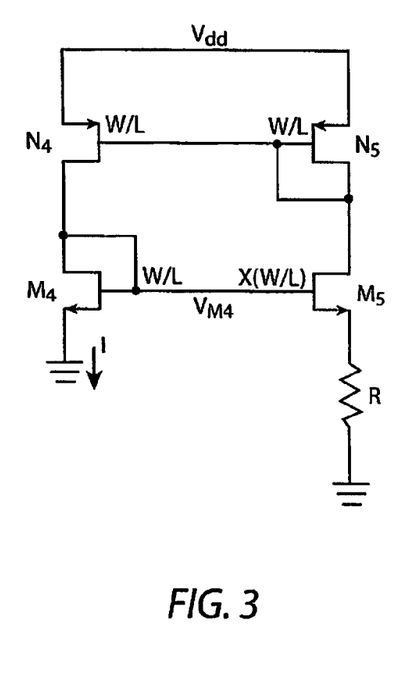
FIG. 3 is a circuit diagram for a biasing circuit to bias the current source transistor in a differential inverter stage.

Turning now to FIG. 3, a supply-independent biasing circuit 300 is shown that achieves this advantageous biasing. Biasing circuit includes a pair of PMOS transistors $N_4$ and $N_5$ in a current mirror relationship such that the drain and gate for transistor $N_5$ as well as the gate for N4 have the same voltage. Since PMOS transistors $N_4$ and $N_5$ form a current mirror, their dimensions as defined through a width (W) and a length (L) ratio W/L are matched. The drain of $N_4$ couples to a drain for an NMOS transistor $M_4$ whose source couples to ground. $M_4$ also has the same W/L ratio. The drain and gate of $M_4$ are coupled together to force $M_4$ into saturation responsive to a gate voltage $V_{M4}$. The drain of $N_5$ couples to a drain of another NMOS transistor $M_5$ whose source couples to ground through a resistance R. In contrast to the other transistors, $M_5$ has a W/L ratio that is a factor X times larger. But for this size difference, transistor $M_4$ and $M_5$ would also be in a current mirror relationship. It may be shown that the transconductance for M4 (denoted as $g_{m4}$) equals $(2/R) \cdot (1 - 1/\sqrt{X})$. The transconductance for thus equals the desired proportionality to a resistance as discussed above with regard to current source transistor $M_3$. Thus, if the dimensions for $M_3$ are made to match those for $M_4$ (same W/L ratio) and if $M_3$ has the same biasing voltage (setting $V_{M3}$ equal to $V_{M4}$ as shown in FIG. 2), then the transconductance $g_{m3}$ also equals $(2/R)(1 - 1/\sqrt{X})$. As discussed previously, the transconductance $g_{m1,2}$ equals $A \cdot g_{m3}$.

The startup condition of $g_{m1,2} \cdot R \geq 1$ thus becomes $2A(1-1/\sqrt{X}) \geq 1$. Such a startup condition depends only on the ratio of the widths for transistors $N_5$ and $M_5$, which is plainly independent of process corners and temperature. The adaptation of such a free-running oscillator into a VCO will now be addressed.

Voltage Controlled Oscillator (VCO)

Figure 4A:
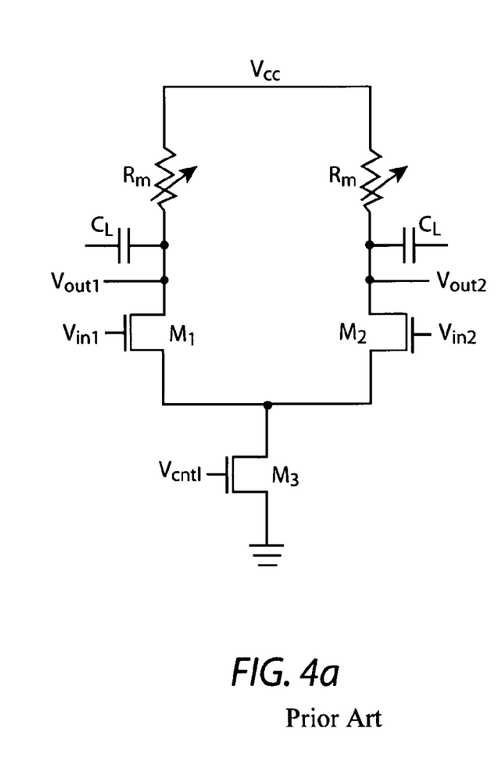
FIG. 4a is a circuit diagram for a conventional VCO stage.

Like a ring oscillator, a VCO also includes a plurality of VCO stages coupled together into a loop analogously as discussed with regard to FIGS. 1a and 1b. However, unlike the fixed load resistances R shown for inverter 200 of FIG. 2, the stages for a VCO have a variable resistance so that the frequency of oscillation may be voltage controlled. An example VCO stage 400 is shown in FIG. 4a. Stage 400 includes transistors $M_1$, $M_2$, and $M_3$ as discussed with regard to inverter 200. For generality, however, the gate voltage for $M_3$ is denoted as $V_{cntl}$. A parasitic capacitance between stages is denoted as $C_L$. It may be seen that inverter stage 400 differs from inverter 200 in that load resistances $R_M$ are adjustable. The resulting voltage-controlled oscillation frequency $f_{vco}$ is proportional to $1/(RMCL)$. This frequency of oscillation can be made independent of process corner and temperature variations as follows.

Figure 5A:
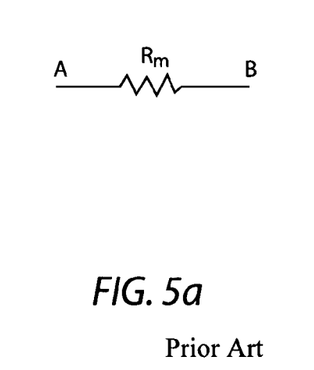
FIG. 5a illustrates a conventional resistance.
Figure 5B:
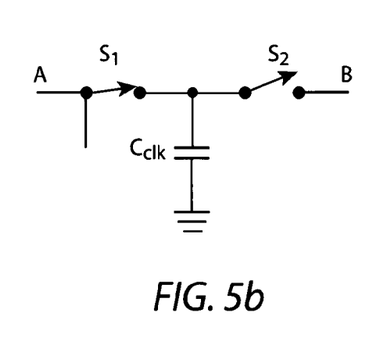
FIG. 5b illustrates a switched-capacitor circuit providing an equivalent resistance.
Figure 5C:
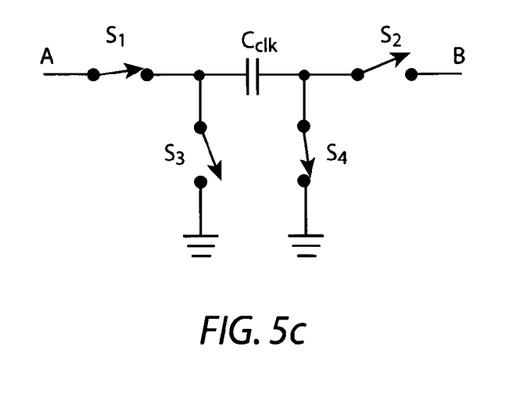
FIG. 5c illustrates a switched-capacitor circuit providing an equivalent resistance that is parasitic insensitive.

The independence stems from the equivalence of resistors and switched-capacitor circuits. This equivalence may be better understood with reference to FIGS. 5a, 5b, and 5c. FIG. 5a shows a resistor of resistance $R_m$ connected between two nodes. For a given amount of voltage potential between nodes A and B, resistance $R_m$ functions to allow the transfer of a certain amount of charge every second from node A to node B. The same function can also be performed by a switched-capacitor circuit 500 shown in FIG. 5b. Switched capacitor circuit 500 includes a capacitor of $C_{clk}$ having one terminal coupled to ground and a remaining terminal alternatively coupled to each of the two nodes through switches $S_1$ and $S_2$. Switches $S_1$ and $S_2$ are opened and closed in non-overlapping opposition to each other according to a clock rate $f_{clk}$. For example, during a first half cycle of the clock, switch $S_1$ is closed and switch $S_2$ is open. During a subsequent half cycle of the clock, switch $S_1$ is opened and switch $S_2$ is closed. The charge moved from node A to node B in one clock period is equal to the average current flowing between the two nodes, i.e., $$I = f_{clk} C_{clk} (V_A - V_B)$$

or $$R_m = \frac{1}{f_{clk} C_{clk}}.$$

Figure 5D:
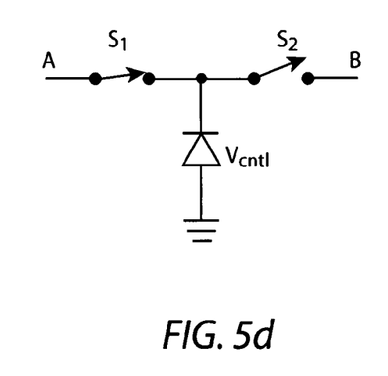
FIG. 5d illustrates a switched-diode circuit with voltage contol ($V_{CNTL}$).

Therefore, switched-capacitor circuit 500 may be viewed as a resistor whose value is equal to $1/f_{clk}C_{clk}$. The equivalence between resistors and switched-capacitors can be made more precise by using extra switches $S_3$ and $S_4$ in a switched-capacitor circuit 505 as shown in FIG. 5c to provide a parasitic-insensitive property. Switches $S_2$ and $S_4$ are opened and closed in parallel. Similarly, switches $S_1$ and $S_3$ are opened and closed in parallel in non-overlapping opposition to switches $S_2$ and $S_4$ according to clock rate $f_{clk}$. The equivalent resistance of a switched-capacitor circuit thus depends on the clocking rate $f_{clk}$ or the capacitance $C_{clk}$. Adjusting either factor adjusts the equivalent resistance. FIG. 5d illustrates an adjustable switched-capacitor circuit in which the fixed capacitance of FIG. 5b is replaced by a varactor having an adjustable capacitance in response to control voltage $V_{CNTL}$. It will be appreciated that an equivalent adjustable switched capacitor could be implemented using a fixed capacitance and an adjustable clocking signal. Similarly, both the clocking frequency and the capacitance may be made adjustable.

Figure 4B:
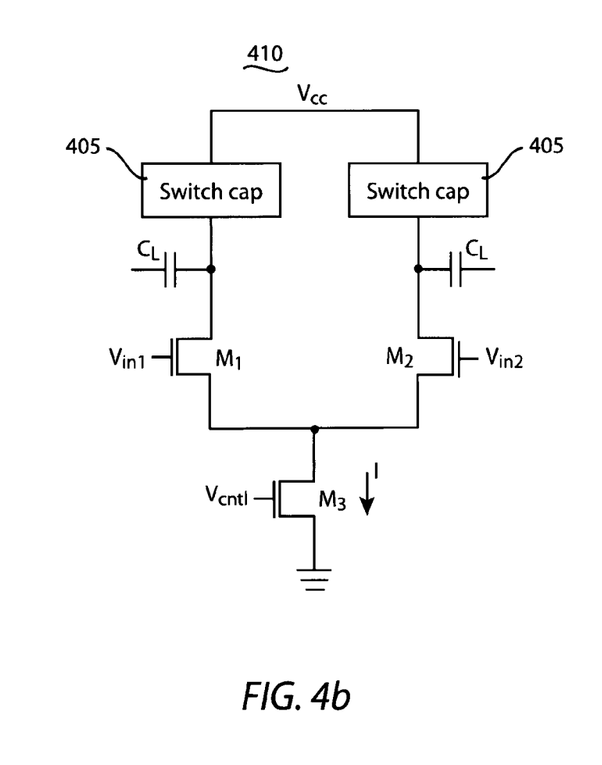
FIG. 4b is a circuit diagram for a VCO stage configured to use switched-capacitor circuits to make the VCO frequency of oscillation independent of process corner and temperature variations.

Given this equivalence, adjustable resistances $R_m$ in VCO stage 400 may be replaced with switched-capacitor circuits 405 for a VCO stage 410 as shown in FIG. 4b. Replacing resistors $R_m$ with their equivalent switched-capacitor circuits leads to the following advantageous VCO frequency of oscillation ($f_{vco}$):

$$f_{vco} \propto \frac{f_{clk} C_{clk}}{C_L}.$$

VCO stage 410 thus enables a VCO oscillation frequency that depends only on the ratio of capacitors. Whatever process corner dependence and temperature dependence that exists in each capacitance will thus cancel out in such a ratio, providing an intrinsic self-compensation that makes $f_{vco}$ independent of temperature and process variations.

Figure 6:
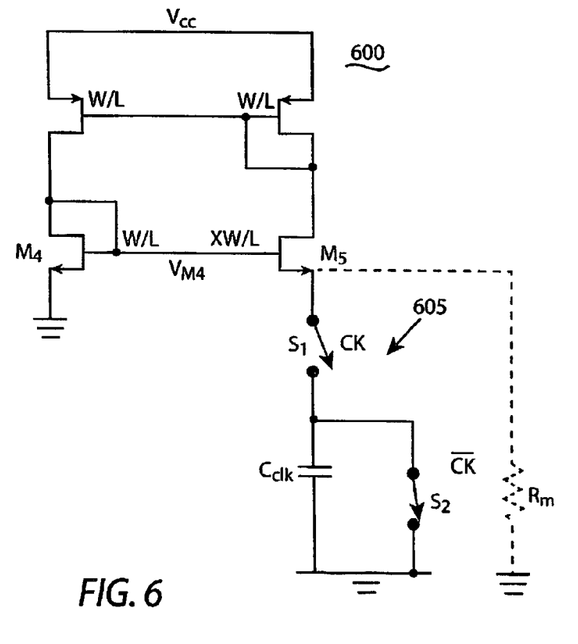
FIG. 6 is a circuit diagram for a biasing circuit to bias the current source transistor in a VCO stage.

Not only can the oscillation frequency be made insensitive to temperature and process corners variations as just discussed but the startup conditions can also be made independent using an analogous biasing circuit as discussed with regard to FIG. 3. As seen in FIG. 6, biasing circuit 600 is modified with regard to biasing circuit 300 of FIG. 3 by replacing the resistance R in circuit 300 with a switched-capacitor circuit 605. It thus follows that the transconductance of M4 in biasing circuit 600 becomes $$g_{m4} = 2(1 - 1/\sqrt{x}) f_{clk} C_{clk}$$

Figure 7:
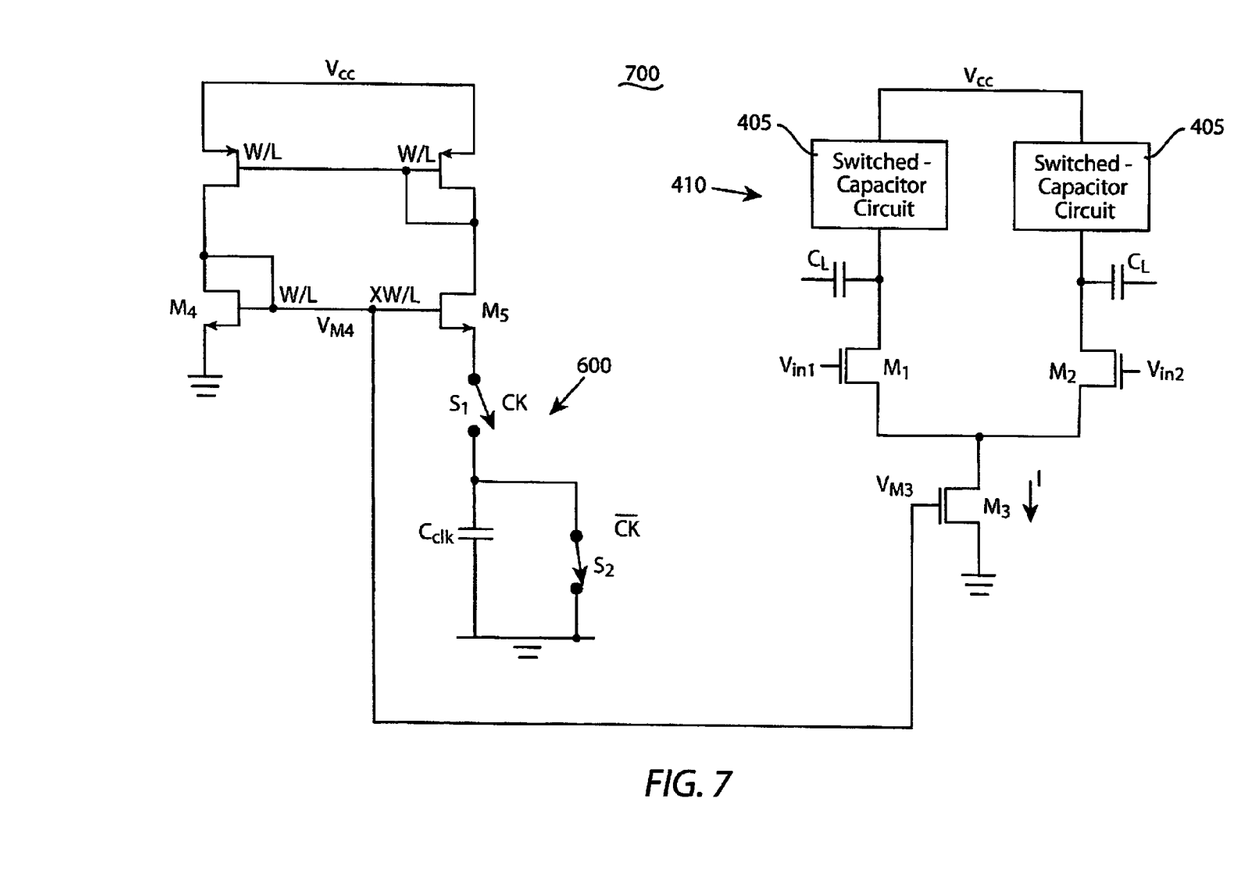
FIG. 7 is a circuit diagram of the VCO stage from FIG. 4b modified to use the biasing circuit of FIG. 6.

An advantageous property for this transconductance is the factor $2(1-1/\sqrt{x})$ in front of the factor $f_{clk} \cdot C_{clk}$. The clock frequency can therefore be a factor of $2(1-1/\sqrt{x})$ (typically as much as 40%) less than other methods. FIG. 7 shows a VCO inverter stage 700 that includes biasing circuit 600. By setting the width and length of $M_3$ equal to that of M4 and by using the same biasing voltage for $M_3$ as for $M_4$, i.e., by setting $V_{M3} = V_{M4}$, $g_{m3}$ becomes $$g_{m3} = g_{m4} = 2(1 - 1/\sqrt{x}) f_{clk} C_{clk}$$

As discussed previously, depending upon the dimensions of $M_3$, $M_2$, and $M_1$, the transconductance of the differential pair $g_{ml2}$, becomes $$g_{m1,2} = A g_{m3}.$$

It thus follows that the VCO start-up condition ($g_{m1,2} R \geq 1$) using a plurality of VCO stages 700 becomes: $2A(1-1/\sqrt{(X)}) \geq 1$. Such a VCO startup condition is independent of power supply variations and insensitive to device parameters and capacitance values. It only depends on the ratio of the values of device widths. Therefore, the resulting start-up is independent of process and temperature variations and of power supply noise.

Figure 8:
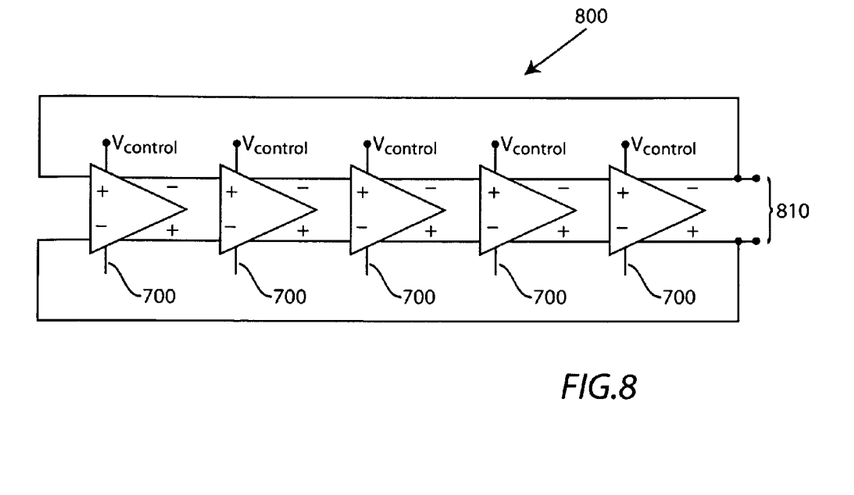
FIG. 8 shows a VCO including a plurality of stages as disclosed in FIG. 7.

FIG. 8 shows a VCO 800 that includes a plurality of VCO stages 700. As discussed with regard to FIG. 5d, adjustable switched-capacitor circuits 405 as shown in FIG. 7 may be adjusted through application of a control voltage to varactors. Thus, each stage 700 receives a control voltage ($V_{control}$) to control the output frequency produced at a pair of differential output nodes 810. The biasing circuit 600 shown in FIG. 7 need not be repeated separately for each stage but instead a single biasing circuit may be common to all the stages.

Figure 9:
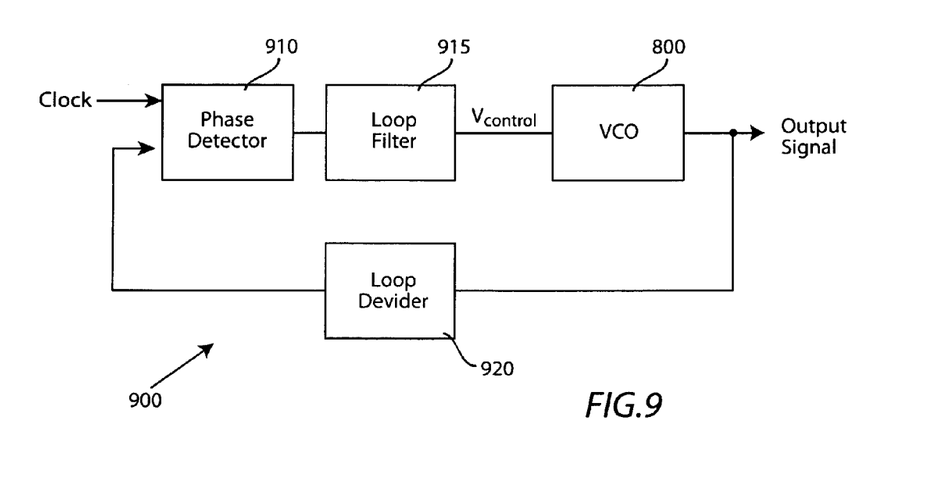
FIG. 9 shows a phase-locked loop (PLL) incorporating the VCO of FIG. 8.

The self-compensating oscillation and startup properties of VCO 800 have many applications. For example, VCO 800 may be incorporated into a phase-locked loop (PLL) 900 as shown in FIG. 9 that includes a phase detector 910, a loop filter 915, and a loop divider 920. VCO 800 responds to the control voltage $V_{control}$ as discussed above to control its output frequency. Advantageously, this output signal frequency will not depend on the particular semiconductor process corner used to manufacture the integrated circuit forming VCO 8900. Moreover, the startup conditions will not depend on operating temperature changes or process variations.

Consider the advantages of such frequency and startup independence as compared to conventional VCOs. In general, it is convention to generate the biasing tail current I in response to a bandgap voltage. Different corners, temperatures, and supply voltages require different transconductances and hence require different biasing currents to start the oscillation. For example, if the fast corner at room temperature requires a current of $I_{ss}$ to start the oscillation, then a slow or hot process corner would, in general, require substantially more current for the start-up (as much 50% or 100% more current than $I_{ss}$). To ensure that oscillation starts in the worst case (usually a hot and slow corner), VCOs based on prior technologies use the worst-case (maximum) biasing current, even though other corners (for example, nominal and fast corners at room temperature) need substantially less currents for start-up, thus wasting considerable power. In contrast, the biasing currents of the VCOs and free running oscillators discussed herein are self-compensating. For example slow and hot corner uses more biasing current (more power) than the nominal corner. And the nominal corner, in turn, uses more biasing current than the fast corner, thus saving considerable power. Furthermore, in contrast to prior technologies, the start-up condition for the VCOs and ring oscillator discussed herein is insensitive to the power supply noise.

It will be appreciated that the techniques and concepts discussed herein are not limited to the specific disclosed embodiments. For example, the present invention encompasses other VCO topologies such as delay variation by positive feedback and delay variation by interpolation. In addition, these techniques and concepts may be implemented in a wide variety of technologies such CMOS, bipolar, SiGe, and GaAs.

It will thus be obvious to those skilled in the art that various changes and modifications may be made without departing from this invention in its broader aspects. For example, the voltage-controlled oscillator disclosed herein may be used in other applications besides phase-locked loops. The appended claims encompass all such changes and modifications as fall within the true spirit and scope of this invention.

I claim:

1. A ring oscillator, comprising:
   a plurality of differential inverters coupled to form a loop, each differential inverter having a differential pair of transistors configured to steer a tail current from a current source, the current source sourcing the tail current responsive to a bias voltage; and
   a bias circuit configured to generate the bias voltage such that a transconductance for each transistor in the differential pairs is proportional to a factor that is a function of a ratio of transistor widths within the bias circuit;
   wherein the bias circuit includes a PMOS current mirror mirroring current into a first NMOS transistor and a second NMOS transistor;
   wherein the PMOS current mirror comprises a first PMOS transistor and a second PMOS transistor;
   wherein a length L for each of the first and second PMOS transistors and for each of the first and second NMOS transistors is the same; and
   wherein a width W for each of the first and second PMOS transistors and for the first NMOS transistor is the same, and wherein a width for the second NMOS transistor has a width of X multiplied by W, where X is a proportionality factor greater than 1.

2. The ring oscillator of claim 1, wherein a source of the second NMOS transistor couples to ground through a resistor.

3. A voltage-controlled oscillator (VCO), comprising:
a plurality of differential inverters coupled to form a loop, each differential inverter having a differential pair of transistors configured to steer a tail current from a current source, the current source sourcing the tail current responsive to a bias voltage, wherein each transistor in the differential pair couples to a power source through a corresponding switching-capacitor circuit; and
a bias circuit configured to generate the bias voltage such that a transconductance for each transistor in the differential pairs is proportional to a factor that is a function of a ratio of transistor widths within the bias circuit;
wherein the bias circuit includes a PMOS current mirror mirroring current into a first NMOS transistor and a second NMOS transistor;
wherein the PMOS current mirror comprises a first PMOS transistor and a second PMOS transistor;
wherein a source of the second NMOS transistor couples to ground through a resistance;
wherein a length L for each of the first and second PMOS transistors and for each of the first and second NMOS transistors is the same; and
wherein a width W for each of the first and second PMOS transistors and for the first NMOS transistor is the same, and wherein a width for the second NMOS transistor has a width of X multiplied by W, where X is a proportionality factor greater than 1.

4. The VCO of claim 3, wherein each corresponding switched-capacitor circuit includes a varactor having an adjustable capacitance responsive to a control voltage.

5. The VCO of claim 3, wherein a switched-capacitor circuit provides the resistance.

6. The VCO of claim 3, wherein a length L for each of the first and second PMOS transistors and for each of the first and second NMOS transistors is the same.

7. A voltage-controlled oscillator (VCO), comprising:
a plurality of differential inverters coupled to form a loop, each differential inverter having a differential pair of transistors configured to steer a tail current from a current source, the current source sourcing the tail current responsive to a bias voltage, wherein each transistor in the differential pair couples to a power source through a corresponding switching-capacitor circuit; and
a bias circuit configured to generate the bias voltage such that a transconductance for each transistor in the differential pairs is proportional to a factor that is a function of a ratio of transistor widths within the bias circuit;
wherein the bias circuit includes a PMOS current mirror mirroring current into a first NMOS transistor and a second NMOS transistor;
wherein the PMOS current mirror comprises a first PMOS transistor and a second PMOS transistor;
wherein a source of the second NMOS transistor couples to ground through a resistance;
wherein a length L for each of the first and second PMOS transistors and for each of the first and second NMOS transistors is the same; and
wherein a width W for each of the first and second PMOS transistors and for the first NMOS transistor is the same, and wherein a width for the second NMOS transistor has a width of X multiplied by W, where X is a proportionality factor greater than 1.

\* \* \* \* \*